United States Patent
Chang

(10) Patent No.: US 6,180,526 B1
(45) Date of Patent: Jan. 30, 2001

(54) METHOD FOR IMPROVING CONFORMITY OF A CONDUCTIVE LAYER IN A SEMICONDUCTOR DEVICE

(75) Inventor: Chung-Liang Chang, Hsinchu (TW)

(73) Assignee: Industrial Technology Research Institute, Hsinchu (TW)

( * ) Notice: Under 35 U.S.C. 154(b), the term of this patent shall be extended for 0 days.

(21) Appl. No.: 09/398,479

(22) Filed: Sep. 17, 1999

(51) Int. Cl.$^7$ ............................... H01L 21/302; H01L 21/461
(52) U.S. Cl. ........................ 438/692; 438/700; 438/745; 438/754; 205/656; 205/669; 205/684
(58) Field of Search .................................... 205/656, 669, 205/684; 438/754, 745, 692, 700

(56) References Cited

U.S. PATENT DOCUMENTS 4,978,639 * 12/1990 Hua et al. ............................ 438/465
5,723,028 * 3/1998 Poris .................................. 204/230.7
5,985,125 * 11/1999 Kim ...................................... 205/123

* cited by examiner

*Primary Examiner*—Robert Kunemund
*Assistant Examiner*—Lynette T. Umez-Eronini
(74) *Attorney, Agent, or Firm*—Harness, Dickey & Pierce, P.L.C.

(57) ABSTRACT

A method for improving the conformity of the conductive layer in a contact hole, thus allowing for the formation of a plug in the resulting contact hole. The aforementioned method includes the following steps. First, immerse the conductive layer of the semiconductor wafer into an electrolyte. The first portion of the conductive layer at the opening of the contact hole contact with the electrolyte, the conductive layer in the contact hole is not in contact with the electrolyte due to the surface tension of the electrolyte. Second, electrically couple the electrolyte to the anode of the source power. Finally, electrically couple the conductive layer to the cathode of the power source until the first portion of the conductive layer at the opening of the contact hole is removed.

14 Claims, 5 Drawing Sheets

METHOD FOR IMPROVING CONFORMITY OF A CONDUCTIVE LAYER IN A SEMICONDUCTOR DEVICE

BACKGROUND OF THE INVENTION

1. Field of the Invention

This invention relates to a method for forming a conductive layer on a semiconductor wafer. More particularly, the present invention relates to a method of forming a conductive layer on a semiconductor wafer of line width smaller than 0.18 microns.

2. Description of the Prior Art

In manufacturing semiconductor devices, the line width is getting smaller, thus the copper metallization will replace the aluminum to meet the RC delay requirement when a process of 0.18 micron or below is followed. Combining TaN and Cu for barrier layer and seed layer with the electroplating deposition is the main trend for the generation of a 0.18-micron process. However, the conformity of the barrier layer and the seed layer is a main issue in fabricating the semiconductor device especially when the process of 0.18 micron or below is utilized.

In some applications, the CVD (Chemical Vapor Deposition) Cu is utilized to fabricate the conductive layer in a semiconductor device to obtain the conformal step coverage, particularly when the line width is small. In general, the copper layer fabricated by CVD uses SF3 containing chemistry as a source, so the resistivity of the resulting copper layer is high. Especially when the thickness of the copper layer is decreased, the resistivity of the copper layer will be increased. Furthermore, the residue after the CVD can create the problem of adhesion between the copper layer and the underlying layer, and the CVD technique is expensive. So the CVD technique suffers from the problems mentioned above, and the CVD technique is suitable for the seed layer of electrochemical deposition when utilizing Cu metallization in 0.18-micron or below process.

To overcome the adhesion problem and to avoid the increase of the resistivity of the Cu layer formed by CVD, the PVD (Physical Vapor Deposition) technique is used in Cu metallization. As shown in FIG. 1, a semiconductor wafer includes a contact hole 10 in the dielectric layer 11 on the substrate 12, and the PVC technique is used to form a barrier layer 15 on the topography of the semiconductor wafer. Generally, the barrier layer 15 is formed of Ta, TiN or TaN. Because the nature of the PVC technique, the overhang 19 is formed in the barrier layer 15 at the corner 17 of the dielectric layer 11.

Before filling the contact hole 10 with copper, a seed layer 20 composed of copper as shown in FIG. 2 is formed on the barrier layer 15. When the seed layer is formed by the PVD technique, the overhang 21 of the seed layer 20 is also formed on the overhang 19 of the barrier layer 15. Even though the seed layer 20 is formed by a ECD (Electrochemical Deposition) technique. Because the current density on the surface of the overhang 19 is greater than the other portion of the barrier layer 15, the deposition rate of copper at the overhang 19 is higher than the other portion of the barrier layer 15. Accordingly, the overhang 21 of the seed layer 20 is formed at the overhang 19, and the conformity of the seed layer 20 is poor even though the electrochemical deposition is utilized.

Because of the overhang formed by the PVD technique, it is very difficult to fill copper in the contact hole. This is particularly true when the 0.18-micron process or below is utilized, in which case the opening of the contact hole may be closed, and the failure of the formation of a via plug may result. A cheap technique that can fabricate a conformal seed layer without the issue of adhesion is necessary in the process of 0.18-micron or below.

In the other respect, the chemical mechanical polish (CMP) is often used to polish the surface of the semiconductor wafer to reduce the altitude difference of the surface of the semiconductor. Yet the higher surface and the lower surface are simultaneously polished during the CMP process. So the resulting planarity is not good enough, thus the planarity of the semiconductor wafer can be further improved by another method.

SUMMARY OF THE INVENTION

One preferred embodiment of the present invention provides a method for improving the conformity of the copper conductive layer in a contact hole. Thus a plug can be formed in the resulting contact hole without void formation in the plug. The aforementioned method includes the following steps. First, immerse the conductive layer of the semiconductor wafer into an electrolyte. The first portion of the conductive layer at the opening of the contact hole is in contact with the electrolyte, the conductive layer in the contact hole is not in contact with the electrolyte due to the surface tension of the electrolyte. Next, electrically couple the electrolyte to the cathode of the source power. Finally, electrically couple the conductive layer to the anode of the power source. Thus the first portion of the conductive layer at the opening of the contact hole is removed to improve the conformity of the copper conductive layer.

In the other preferred embodiment of the present invention, a method for improving the planarity of a conductive layer on the semiconductor wafer is presented. The method mentioned above includes the following steps. First, immerse the conductive layer into an electrolyte. The conductive layer includes the first portion and the second portion, and the second portion of the conductive layer is thinner than the first portion of the conductive layer. The first portion of the conductive layer is in contact with the electrolyte, and the second portion of the conductive layer is not in contact with the electrolyte due to a surface tension of the electrolyte. Subsequently, electrically couple the electrolyte to the cathode of a source power. Finally, electrically couple the conductive layer to an anode of the power source until the electrolyte is in contact with the second portion of the conductive layer.

BRIEF DESCRIPTION OF THE DRAWINGS

The above features of the present invention will be more clearly understood from consideration of the following descriptions in connection with the accompanying drawings in which.

DESCRIPTION OF THE PREFERRED EMBODIMENT

Due to the issues of adhesion, and cost constraints, the time delay requirement of the fabricated seed layer, it is not suitable to use the CVD technique to fabricate the seed layer. However, the PVD technique itself dose not fit the requirement of the conformity of the seed layer, either. This is so because the conformity of a seed layer formed before the filling in the contact hole affects the success or failure of the formation of a via or a plug especially when a process of 0.18 micron or below is used.

Figure 1:
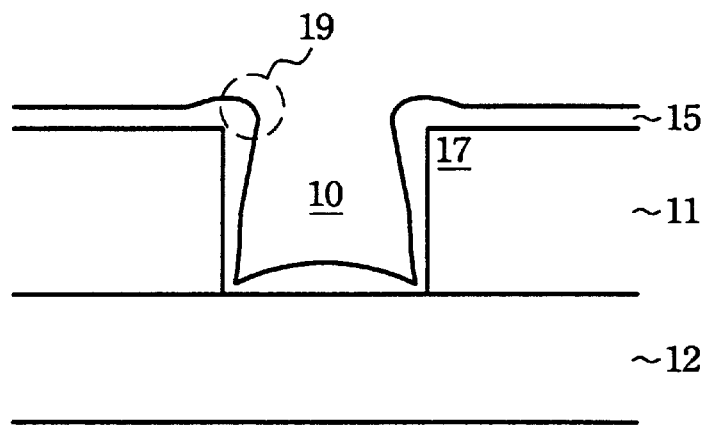
FIG. 1 is a cross-sectional view of a semiconductor wafer on which a barrier layer is formed in the contact hole and on the dielectric layer of the semiconductor wafer.
Figure 2:
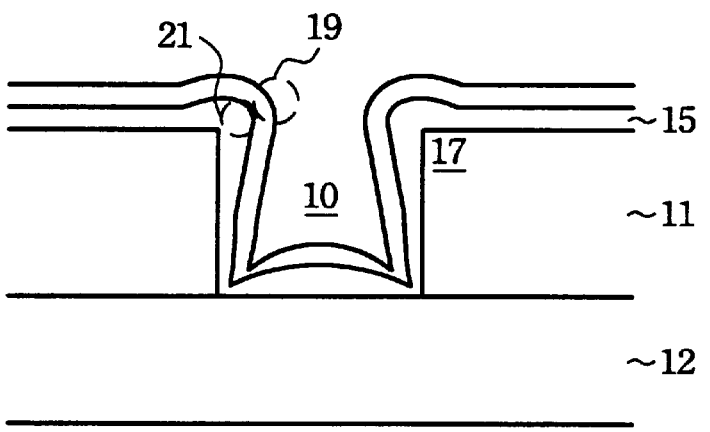
FIG. 2 is a cross-sectional view of a semiconductor wafer on which a copper conductive layer is formed on the barrier layer of the resulting semiconductor wafer according to the prior art.
Figure 3:
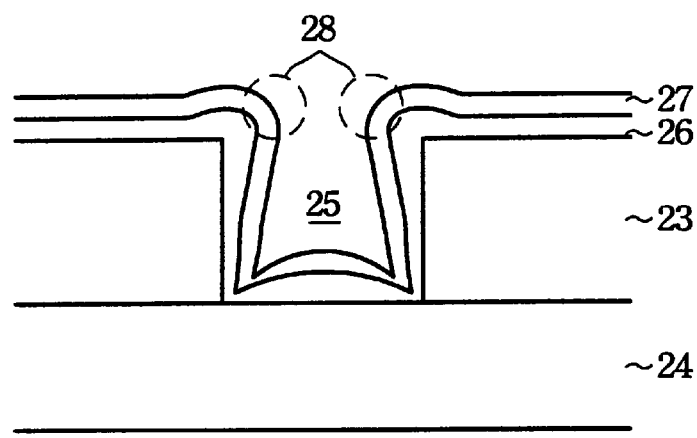
FIG. 3 is a cross-sectional view of a semiconductor wafer where a copper conductive layer is formed on the barrier layer of the semiconductor wafer before the processes according to the method presented in the present invention.

The present invention provides a method for filling the contact hole. In the first preferred embodiment of the present invention, the semiconductor wafer is put in the electrolytic cell of the electrolyser. As shown in FIG. 3, the first layer 23 is formed on the substrate 24, and the contact hole 25 is formed in the first layer 23. Then a barrier layer 26 is formed on the surface of the first layer 23 and in the contact hole 25. A seed layer 27 is formed on the barrier layer 26 using the technique other than CVD, so the overhang 28 is formed at the opening of the contact hole 25 as in the prior art. The seed layer 27 is formed of a conductive material that is used to form the conductive line in the semiconductor wafer, i.e., the seed layer 27 is formed before performing the metallization in fabricating the semiconductor wafer.

Figure 4:
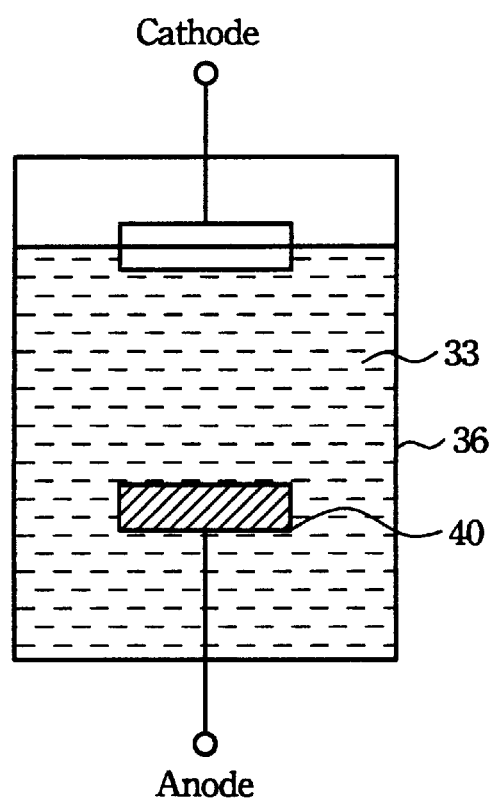
FIG. 4 is a cross-sectional view of the apparatus used to electroplate the conductive layer on the surface of the barrier layer of the semiconductor wafer.

Although the seed layer 27 still has the overhang 28, one preferred embodiment of the present invention provides a method for reducing the overhang 28 in the same reaction chamber that is used to form the seed layer 27. In one preferred embodiment of the present invention, the seed layer 27 of copper is formed by electroplating a copper layer on the barrier layer 26. The equipment that is used to electrochemically deposit the semiconductor wafer to form the barrier layer 26 is shown in FIG. 4. In FIG. 4, the apparatus used to form the seed layer 27 is in an electroplate mode, and the semiconductor wafer including the barrier layer 26 (FIG. 3) is immersed in the electrolyte 33 contained in the electrolytic cell 36. In addition, the electrode 40 is electrically coupled to the anode of the power source, and the substrate 24 is electrically coupled to the cathode of the power source.

Figure 5:
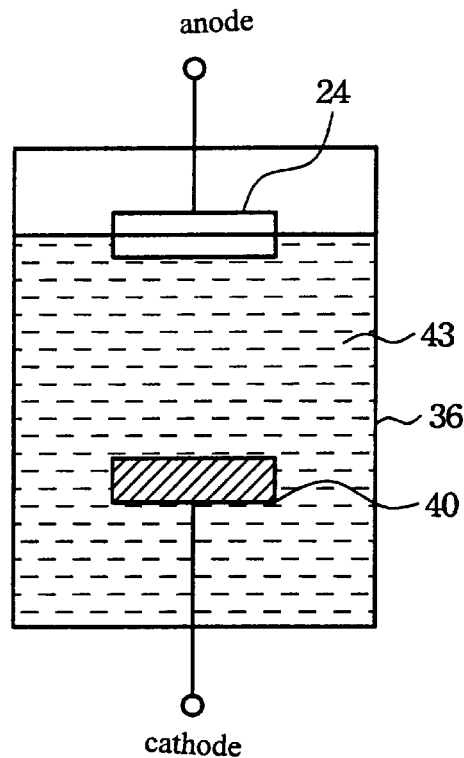
FIG. 5 is a cross-sectional view of the apparatus used to remove a portion of the conductive layer on the barrier layer of the semiconductor wafer by electrolysis.
Figure 6:
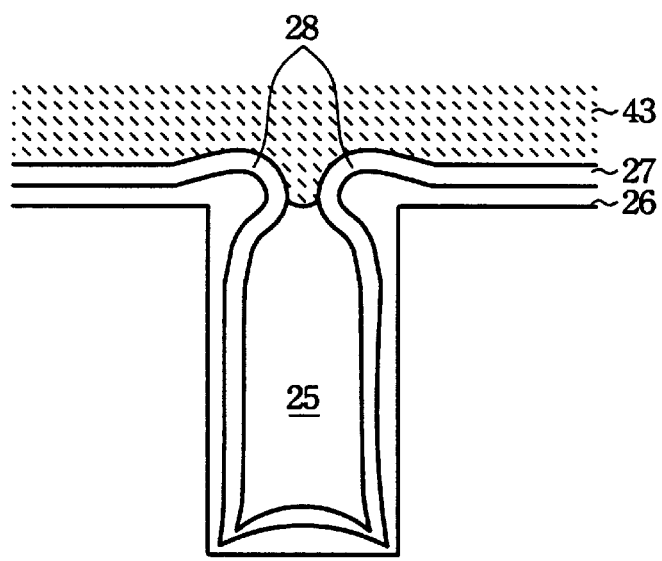
FIG. 6 is a cross-sectional micro view of the wafer in which the electrolyte stops at the opening of the contact hole, and the electrolyte is only in contact with the overhang of the conductive layer.

After the seed layer is electroplated on the surface of the semiconductor wafer, one preferred embodiment of the present invention provides a method for reducing the overhang on the surface of the seed layer. As shown in FIG. 5, the apparatus used to reduce the overhang of the seed layer is in the electrolysis mode. In the electrolysis mode, the substrate 24 of the semiconductor wafer is not immersed in the weak wetting electrolyte 43. During the electrolysis mode, the electrode 40 is electrically coupled to the cathode of the power source, and the semiconductor wafer is electrically coupled to the anode of the power source. When the semiconductor wafer is in the electrolysis mode, the cross-sectional micro-view of the semiconductor wafer showing the contact hole 25 is illustrated in FIG. 6. The polyethylene glycol and/or other surfactant that can modify the surface tension are added into the electrolyte 33 to produce the weak wetting electrolyte 43. The surface tension of the weak wetting electrolyte 43 can be adjusted by controlling the amount of surfactant to prevent the weak wetting electrolyte 43 from entering the contact hole 25. Thus the overhang 28 can be kept in contact with the weak wetting electrolyte 43 when the semiconductor wafer is immersed into the weak wetting electrolyte 43.

As shown in FIG. 6, the curvature on the surface of the overhang 28 is greater than the other portion of the seed layer 27. According to the current distribution theorem, the current density on the surface of the overhang 28 is greater than the current density on the other portion of the seed layer 27. So the removal rate at the surface of the overhang 28 is greater than the surface of the other portion of the seed layer 27. Thus the overhang 28 is partially eliminated and the opening of the contact hole 25 is enlarged by the method provided by the present invention.

Figure 7:
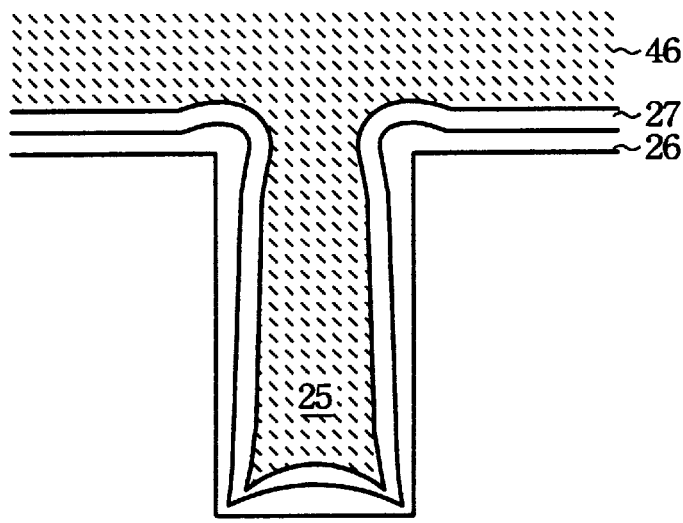
FIG. 7 shows a cross-sectional micro view of the wafer where the overhang of the conductive layer is removed, and the contact hole is filled with the electrolyte.
Figure 8:
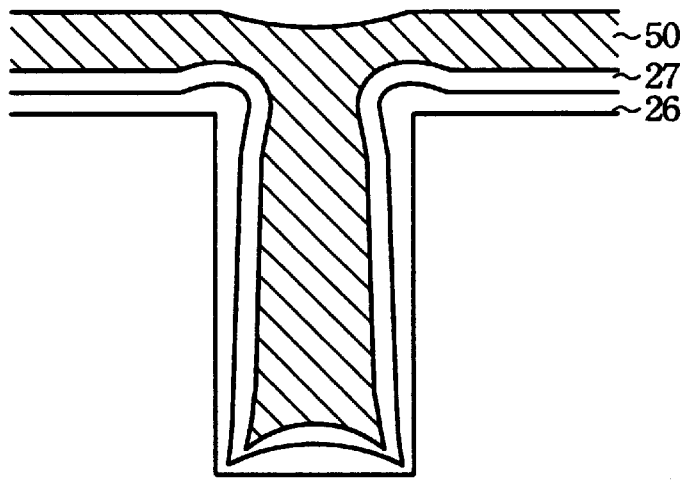
FIG. 8 shows a cross-sectional view of the wafer where the conductive layer is formed in the contact hole according to one preferred embodiment of the present invention.

Because the conformity of the seed layer 27 is improved after the electrolysis step, the subsequent step is to immerse the semiconductor wafer into the good wetting electrolyte. Because the surface tension of the good wetting electrolyte is greater than that of the weak wetting electrolyte, the good wetting electrolyte can enter the contact hole. As shown in FIG. 7, the good wetting electrolyte 46 is filled into the contact hole 25, then the second electroplating step is used to form a via plug. The semiconductor wafer shown in FIG. 7 is electrically coupled to the cathode of the power source, subsequently, the conductive layer 50 is formed on the seed layer 27 as well as in the contact hole. Thus the metallization of manufacturing the semiconductor wafer is finished. The enhanced Cu seed layer conformity and continuity for electrochemical deposition is obtained in one preferred embodiment of the present invention. The conformity problem of the Cu seed layer in a process of 0.18 or below is solved in one preferred embodiment of the present invention.

Figure 9:
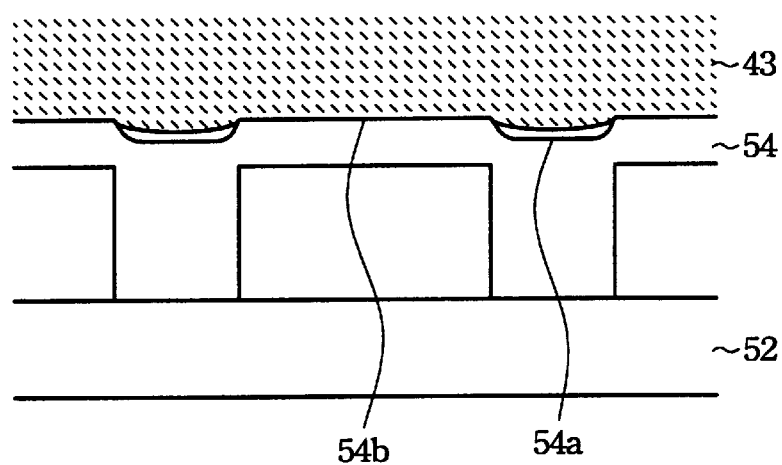
FIG. 9 shows a cross-sectional view of the semiconductor wafer where the semiconductor wafer is immersed in the electrolyte and a first portion of the conductive layer is in contact with the electrolyte, and the second portion of the conductive layer is not in contact with the electrolyte due to the surface tension of the electrolyte according to one preferred embodiment of the present invention.

In one preferred embodiment of the present invention, the conductive layer is formed of copper, so the via plug made of copper can be formed after etch back of the conductive layer 50. In the other preferred embodiment of the present invention, as shown in FIG. 9, the semiconductor wafer has a substrate 52, and a conductive layer 54. Because of the topography of the underlying layer, the surface of the conductive layer 54 having a first portion 54a and a second portion 54b is formed during depositing of the conductive layer 54. In order to reduce the altitude difference between the first portion 54a and the second portion 54b, the semiconductor wafer having the first portion 54a and the second portion 54b is immersed in the weak wetting electrolyte 43 (FIG. 5). Then the electrolysis step is utilized to proceed with the semiconductor wafer.

Figure 10:
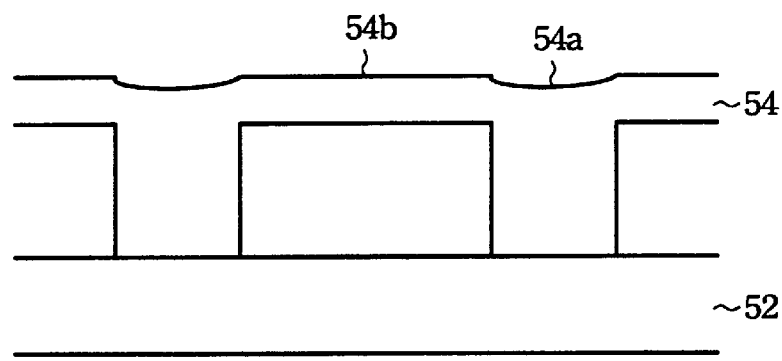
FIG. 10 is a cross-sectional view of the semiconductor wafer where the conductive layer is formed on the semiconductor wafer and the plug is formed according to the other preferred embodiment of the present invention.
Figure 11:
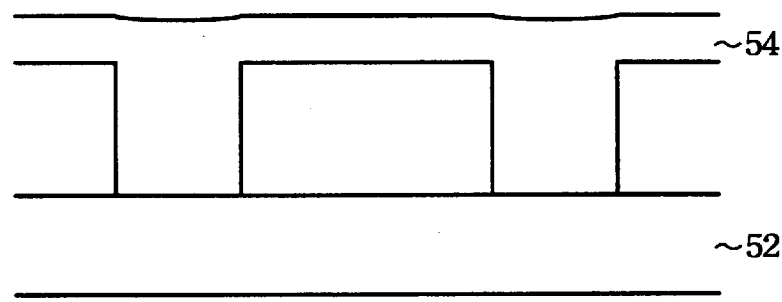
FIG. 11 shows a cross-sectional view of the semiconductor wafer where the resulting semiconductor wafer been proceed with by a chemical mechanical polishing step.

Due to the surface tension of the weak wetting electrolyte 43, the first portion 54a dose not contact the weak wetting electrolyte 43 at the beginning of the electrolysis step. On the contrary, the second portion 54b contacts with the weak wetting electrolyte 43 at the beginning of the electrolysis step. So the altitude of the first portion 54a is not changed, and the altitude of the second portion 54b is lowered during the electrolysis step. The cross-sectional view of the resultant semiconductor wafer is shown in FIG. 10. The altitude difference between the first portion 54a and the second portion 54b is reduced after the electrolysis step presented by the other preferred embodiment of the present invention. So the other preferred embodiment of the present invention can planarize the surface of the conductive layer on the semiconductor wafer. To further planarize the surface of the conductive layer, chemical mechanical polish is used to polish the surface of the conductive layer on the semiconductor wafer. The cross-sectional view of the further planarized semiconductor wafer is shown in FIG. 11. So the electrochemical-polish planarization (ECPP) can be used to planarize the surface of the film on the semiconductor wafer globally.

As will be understood by persons skilled in the art, the foregoing preferred embodiment of the present invention is illustrative of the present invention rather than limiting of the present invention. Having described the invention in connection with a preferred embodiment, for example, if the various electrolyte or the various conductive layer is used in the preferred embodiment. As long as the surface tension of the electrolyte is used in the electrolysis step removing a portion of a layer on the semiconductor wafer, the modification will now suggest itself to those skilled in the art. While the preferred embodiment of the invention has been illustrated and described, it will be appreciated that various changes can be made therein without departing from the spirit and scope of the invention.

What is claimed is:

1. A method for removing a first portion of a conductive layer at an opening of a hole on a semiconductor wafer to improve conformity of said conductive layer, said method comprising:

immersing said conductive layer into an electrolyte, said first portion at said opening being contact with said electrolyte, said electrolyte being not entering said hole due to a surface tension of said electrolyte;

electrically coupling said electrolyte to a cathode of a source power; and electrically coupling said conductive layer to an anode of said power source till said first portion of said conductive layer at said opening of said hole being removed.

2. The method as claim 1, wherein said method further comprises a step of electrically coupling said conductive layer to said anode of said power source till said hole being filled with said electrolyte.

3. The method as claim 1, wherein said conductive layer comprises copper.

4. The method as claim 1, wherein a width of said opening of said hole is about 0.15–0.18 microns.

5. A method for removing a surface of a first portion of a conductive layer of a semiconductor wafer to improve planarity of said conductive layer, said method comprising:

immersing said conductive layer into an electrolyte, said conductive layer comprising said first portion and a second portion, said second portion of said conductive layer being thinner than said first portion of said conductive layer, said first portion of said conductive layer being contact with said electrolyte, said second portion of said conductive layer being not contact with said electrolyte due to a surface tension of said electrolyte;

electrically coupling said electrolyte to a cathode of a source power; and electrically coupling said conductive layer to an anode of said power source till said electrolyte contacting with said second portion of said conductive layer.

6. The method as claim 5, wherein said method comprises a step of utilizing a chemical mechanical polish to polish said conductive layer on said semiconductor wafer.

7. The method as claim 5, wherein said conductive layer comprises copper.

8. A method for forming a plug in a contact hole on a semiconductor wafer, said method comprising:

immersing said semiconductor wafer into a first electrolyte, said semiconductor wafer comprising a substrate, a first layer being on said substrate, and a barrier layer that inside said contact hole as well as on said exposed substrate and said first layer;

electrically coupling said electrolyte to an anode of a source power;

electrically coupling said first layer to a cathode of said power source to form a conductive layer on said first layer;

immersing said conductive layer into a second electrolyte, an opening of said contact hole being contact with said second electrolyte, said second electrolyte being not entering said contact hole due to a surface tension of said second electrolyte;

electrically coupling said second electrolyte to said cathode of said source power; and electrically coupling said conductive layer to said anode of said power source till said first portion of said conductive layer at said opening of said contact hole being removed.

9. The method as claim 8, wherein said method further comprises a step of electrically coupling said conductive layer to said anode of said power source till said contact hole being filled with said second electrolyte.

10. The method as claim 8, wherein surface tension of said first electrolyte is greater than surface tension of said second electrolyte.

11. The method as claim 10, wherein said second electrolyte is formed by adding a chemistry to said first electrolyte.

12. The method as claim 11, wherein said chemistry comprises polyethylene glycol.

13. The method as claim 8, wherein said conductive layer comprises copper.

14. The method as claim 8, wherein a width of said opening of said contact hole is about 0.15–0.18 microns.

* * * * *